United States Patent [19]
Heide et al.

[11] Patent Number: 5,675,275
[45] Date of Patent: Oct. 7, 1997

[54] ARRANGEMENT FOR THE GENERATION OF A HIGH-FREQUENCY NEEDLE PULSE TRAIN AND OF AN INVERTED NEEDLE PULSE TRAIN

[75] Inventors: Patric Heide, München; Rudolf Schwarte, Netphen, both of Germany

[73] Assignee: Siemens Aktiengesellschaft, Munich, Germany

[21] Appl. No.: 640,841

[22] PCT Filed: Sep. 5, 1995

[86] PCT No.: PCT/DE95/01198

§ 371 Date: May 7, 1996

§ 102(e) Date: May 7, 1996

[87] PCT Pub. No.: WO96/08081

PCT Pub. Date: Mar. 14, 1996

[30] Foreign Application Priority Data

Sep. 7, 1994 [DE] Germany ............ 44 31 885.5

[51] Int. Cl.[6] ............... H03K 4/02; H03K 17/74
[52] U.S. Cl. ............... 327/181; 327/114; 327/164; 327/168; 333/20
[58] Field of Search ............... 327/164, 168, 327/181, 182, 183, 91, 291, 304, 306, 114, 116; 333/20

[56] References Cited

U.S. PATENT DOCUMENTS

| | | | |
|---|---|---|---|
| 3,173,020 | 3/1965 | Seeds | 327/170 |
| 3,997,843 | 12/1976 | Wohlers | 327/181 |
| 4,158,784 | 6/1979 | Curtice | 327/114 |

FOREIGN PATENT DOCUMENTS

| | | |
|---|---|---|
| 0238745 | 9/1987 | European Pat. Off. . |
| 1447443 | 6/1965 | France . |
| 1145101 | 1/1977 | United Kingdom . |

OTHER PUBLICATIONS

Internatiionale Elektronische Rundschau, vol. 24, No. 7, W. Pfeiffer, "Erzeugung von Rechteckimpulsen mit Avalanche–Transistoren" dated Jul. 1970, pp. 178–180.

Journal of Physics E Scientific Instruments, vol. 17, No. 3, Georgi et al, A 5kV nanosecond–risetime pulse generator gating an electro–optical shutter, Mar. 1984, pp. 204–207.

Primary Examiner—Timothy P. Callahan
Assistant Examiner—Dinh T. Le
Attorney, Agent, or Firm—Hill, Steadman & Simpson

[57] ABSTRACT

In order to sample high-frequency signals, it is necessary to have a needle pulse train and a needle pulse train which is inverted with respect thereto. By means of a switch (T) which is controlled by a clock signal (U), a positive operating voltage ($U_{B+}$) is applied for a limited period of time to a first conductor ($L_1$) and a negative operating voltage ($U_{B-}$) is applied for a limited period of time to a second conductor ($L_2$). The two conductors ($L_1$, $L_2$) are connected via a respective diode ($D_1$, $D_2$), which are biased differently, to a respective resistor ($RV_1$, $RV_2$), which is connected to ground, and to a respective capacitor ($C_1$, $C_2$). The respective capacitors connected to a respective further resistors ($RL_1$, $RL_2$), which is connected to ground, the needle pulse train being present at one resistor and the needle pulse train which is inverted with respect to the first being present at the other resistor.

13 Claims, 1 Drawing Sheet

5,675,275

ARRANGEMENT FOR THE GENERATION OF A HIGH-FREQUENCY NEEDLE PULSE TRAIN AND OF AN INVERTED NEEDLE PULSE TRAIN

BACKGROUND OF THE INVENTION

Sampling oscilloscopes are usually used for the oscillographic display of electrical signals having very fast rise times in the pico- or subpico- range. By sampling a repetitive, periodic signal in a manner staggered over time, the wave form of this signal is reconstructed in a time scale which is slower by an order of magnitude. Sampling is done using sampling gates, which are activated by high-frequency needle pulses. For reasons of symmetry, a needle pulse train and an exactly symmetrical needle pulse train which is inverted with respect thereto are frequently required for this purpose.

SUMMARY OF THE INVENTION

The object of the invention is to specify an arrangement for the generation of a high-frequency needle pulse train and of an inverted needle pulse train.

In general terms the present invention is an arrangement for generating a high-frequency needle pulse train and an inverted needle pulse train. A switch, which can be controlled by a clock signal, has a first output connected to one end of a first conductor having a length L and to a first resistor to which a positive operating voltage is applied. A second output of the switch is connected to one end of a second conductor, which is identical to the first conductor and which has a length L, and to a second resistor to which a negative operating voltage is applied. The other end of the first conductor is connected to a first terminal of a first diode. The other end of the second conductor is connected to a first terminal of a second diode which is biased oppositely to the first diode. A second terminal of the first diode is connected to a third resistor, which is connected to ground, and to a terminal of a first capacitor. A second terminal of the second diode is connected to a fourth resistor, which is connected to ground, and to a terminal of a second capacitor. A second terminal of the first capacitor is connected to a fifth resistor, which is connected to ground and via which the needle pulse train can be outputted. A second terminal of the second capacitor is connected to a sixth resistor, which is connected to ground and via which the inverted needle pulse train can be outputted.

Advantageous developments of the present invention are as follows.

The controllable switch is a transistor.

The needle pulse width is set via the length L of the conductors.

One or more of the first, second, third and fourth resistors are respectively replaced by one or more coils.

Each of the first conductor and the second conductor is an asymmetrical line. The asymmetrical line is coaxial cable or a microstrip line.

The first conductor and the second conductor together form a symmetrical line. The symmetrical line has two striplines, one two-wire line or one coplanar line.

The first and the second conductor have the same electrical effect, the first and the second diode have the same electrical effect, the third and fourth resistors have the same electrical effect, the first and second capacitors, have the same electrical effect, and the fifth and sixth resistors have the same electrical effect.

The arrangement is used for signal sampling in periodic events.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
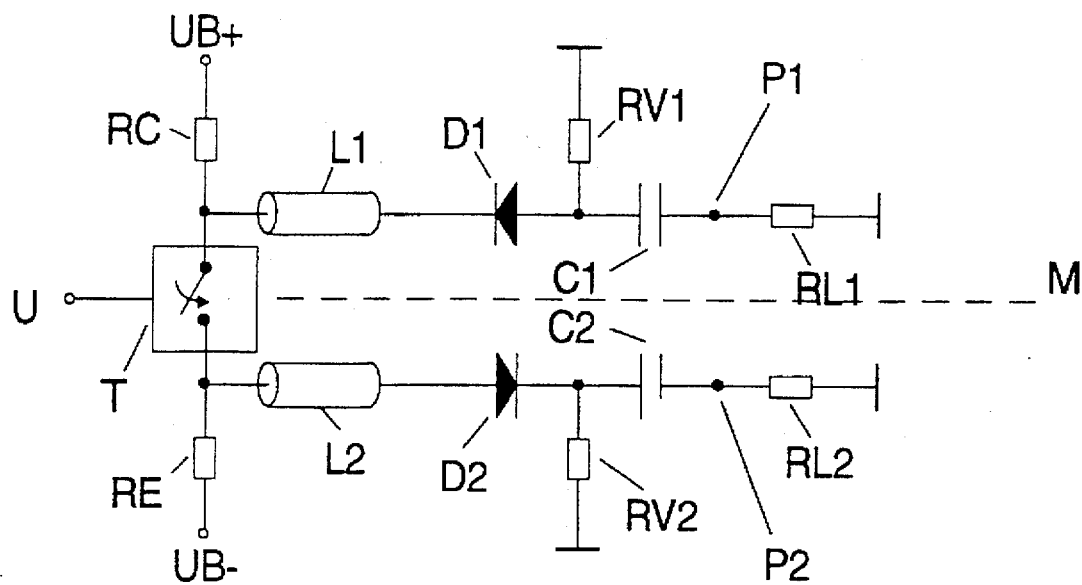
FIG. 1 shows one possible embodiment of the arrangement according to the invention.
Figure 2:
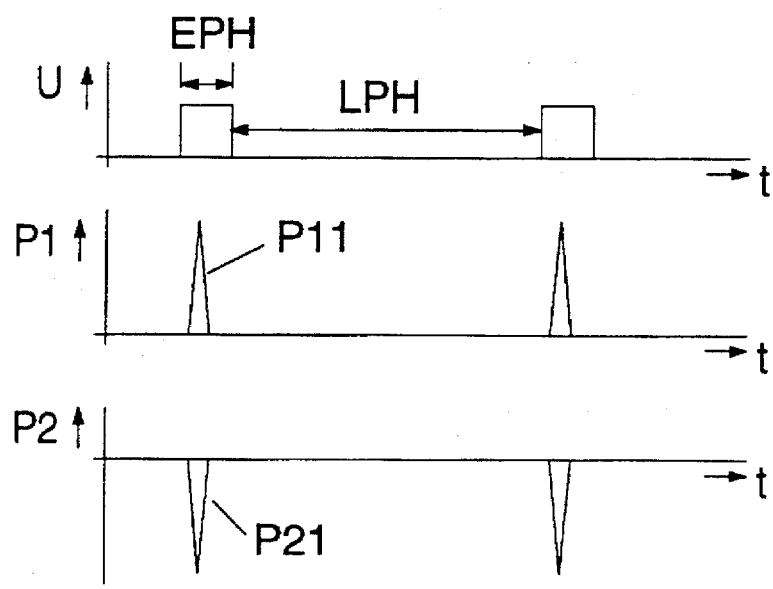
FIG. 2 shows a timing diagram associated with the arrangement shown in FIG. 1.

In the arrangement which is shown in FIG. 1 and is used for the purpose of generating the needle pulse trains $P_1$ and $P_2$, the switch T is in the off state during the charging phase LPH indicated in FIG. 2. The conductor $L_1$ is charged to the operating voltage $U_{B+}$ via the resistor RC and the conductor $L_2$ is charged to the operating voltage $U_{B-}$ via the resistor RE. The diode $D_1$ is in the off state during the charging phase LPH since it is connected to the resistors RC and $RV_1$ in a manner that is active for low frequencies. The diode $D_2$ is likewise in the off state during the charging phase LPH since it is connected to the resistors RE and $RV_2$ in a manner that is active for low frequencies. Therefore, the diode $D_1$ or $D_2$ acts as an open circuit for high frequencies at that end of the respective conductor $L_1$ or $L_2$ which is opposite to the switch T.

During the discharging phase EPH, the switch T, under the control of the clock signal U, is short-circuited, that is to say requires a low resistance.

The energy stored in the conductor $L_1$ during the charging phase LPH flows away during the discharging phase EPH in the form of a short positive needle pulse $P_{11}$ via the short-circuited switch T in the direction of the conductor $L_2$ and switches the diode $D_2$ on for the duration of the needle pulse $P_{11}$. The capacitor $C_2$ acts as a short circuit for high frequencies, with the result that the needle pulse $P_{11}$ can be picked off at the load resistor $RL_2$. At the same time, the energy stored in the conductor $L_2$ during the charging phase LPH correspondingly flows away during the discharging phase EPH in the form of a short negative needle pulse $P_{21}$ via the short-circuited switch T in the direction of the conductor $L_1$ and switches the diode $D_1$ on for the duration of this needle pulse $P_{21}$. Here, too, the capacitor $C_1$ acts as a short circuit for high frequencies, with the result that the needle pulse $P_{21}$ can be picked off at the load resistor $RL_1$.

By driving the switch T using a periodically repeated signal U, as indicated in FIG. 2, the processes that have been described are correspondingly repeated periodically.

The circuit specified has a symmetrical structure with respect to a center line M. The advantage of this symmetry is that the generated needle pulses are also symmetrical.

In order that the circuit functions correctly, it is necessary that the conductors $L_1$ and $L_2$ are asymmetrical lines having an identical structure, for example coaxial cable or microstrip line. As an alternative, it is also possible to use just one symmetrical line instead of two asymmetrical lines, for example the conductors $L_1$ and $L_2$ may be the two conductors of a symmetrical two-wire line or of a coplanar line. The advantages of using a symmetrical line are that the obtainable symmetry of the needle pulses is improved and less circuitry is required.

The lengths of the conductors $L_1$ and $L_2$ must be chosen to be identical and determine the duration of the needle pulses. The voltages $U_{B+}$ and $U_{B-}$ must be chosen to be identical, apart from their sign, and determine the amplitude of the needle pulses.

In order that the circuit functions correctly, it is also necessary that the characteristic impedances of the conductors $L_1$ and $L_2$ and of the load resistors $RL_1$ and $RL_2$ are identical. If one symmetrical line is used as conductors instead of two asymmetrical lines, then the load impedances must be chosen to be identical to half the characteristic impedance of the symmetrical line.

The function of the switch T can be fulfilled by a transistor.

The function of the resistors RC, RE, $RV_1$ and $RV_2$ can also be fulfilled by coils.

The arrangement specified can be used for driving a signal sampling unit.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. An arrangement for generating a high-frequency needle pulse train and an inverted needle pulse train, comprising:

a switch which is controlled by a clock signal, the switch having a first output connected to a first end of a first conductor having a length L and to a first resistor to which a positive operating voltage is applied, and the switch having a second output connected to a first end of a second conductor, which is identical to the first conductor and which has the length L, and to a second resistor to which a negative operating voltage is applied;

a second end of the first conductor connected to a first terminal of a first diode;

a second end of the second conductor connected to a first terminal of a second diode which is biased oppositely to the first diode;

a second terminal of the first diode connected to a third resistor, which is connected to ground, and to a first terminal of a first capacitor;

a second terminal of the second diode connected to a fourth resistor, which is connected to ground, and to a first terminal of a second capacitor;

a second terminal of the first capacitor connected to a fifth resistor, which is connected to ground and via which the needle pulse train is outputted; and a second terminal of the second capacitor connected to a sixth resistor, which is connected to ground and via which the inverted needle pulse train is outputted.

2. The arrangement as claimed in claim 1, wherein the controllable switch is a transistor.

3. The arrangement as claimed in claim 1, wherein the needle pulse width is determined via the length of the first and second conductors.

4. The arrangement as claimed in claim 1, wherein at least one of the first, second, third and fourth resistors are respectively replaced by a respective coil.

5. The arrangement as claimed in claim 1, wherein each of the first conductor and the second conductor is an asymmetrical line.

6. The arrangement as claimed in claim 5, wherein the asymmetrical line is a coaxial cable.

7. The arrangement as claimed in claim 1, wherein the first conductor and the second conductor together form a symmetrical line.

8. The arrangement as claimed in claim 7, wherein the symmetrical line has two striplines.

9. The arrangement as claimed in claim 1, wherein the first and the second conductors have the same electrical values, the first and the second diodes have the same electrical values, the third and fourth resistors, the first and the second capacitors have the same electrical values and the fifth and sixth resistors have the same electrical values.

10. An arrangement for generating a high-frequency needle pulse train and an inverted needle pulse train, for signal sampling of a periodic signal, comprising:

a switch which is controlled by a clock signal, the switch having a first output connected to a first end of a first conductor having a length L and to a first resistor to which a positive operating voltage is applied and the switch having a second output connected to a first end of a second conductor, which is identical to the first conductor and which has the length L, and to a second resistor to which a negative operating voltage is applied;

a second end of the first conductor connected to a first terminal of a first diode;

a second end of the second conductor connected to a first terminal of a second diode which is biased oppositely to the first diode;

a second terminal of the first diode connected to a third resistor, which is connected to ground, and to a first terminal of a first capacitor;

a second terminal of the second diode connected to a fourth resistor, which is connected to ground, and to a first terminal of a second capacitor;

second terminal of the first capacitor connected to a fifth resistor, which is connected to ground and via which the needle pulse train is outputted; and a second terminal of the second capacitor connected to a sixth resistor, which is connected to ground and via which the inverted needle pulse train is outputted.

11. The arrangement as claimed in claim 5, wherein the asymmetrical line is a microstrip line.

12. The arrangement as claimed in claim 7, wherein the symmetrical line has one two-wire line.

13. The arrangement as claimed in claim 7, wherein the symmetrical line has one coplanar line.

* * * * *